United States Patent
Zhang

(10) Patent No.: US 11,031,504 B2
(45) Date of Patent: *Jun. 8, 2021

(54) GATE ALL AROUND VACUUM CHANNEL TRANSISTOR

(71) Applicant: STMICROELECTRONICS, INC., Coppell, TX (US)

(72) Inventor: John H. Zhang, Altamont, NY (US)

(73) Assignee: STMICROELECTRONICS, INC., Coppell, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/878,287

(22) Filed: May 19, 2020

(65) Prior Publication Data

US 2020/0279954 A1    Sep. 3, 2020

Related U.S. Application Data

(60) Continuation of application No. 15/820,010, filed on Nov. 21, 2017, now Pat. No. 10,680,112, which is a
(Continued)

(51) Int. Cl.
*H01L 29/786* (2006.01)
*H01L 29/423* (2006.01)
(Continued)

(52) U.S. Cl.
CPC ...... *H01L 29/78642* (2013.01); *H01J 21/105* (2013.01); *H01L 29/42392* (2013.01); *H01L 29/66666* (2013.01); *H01L 29/78696* (2013.01)

(58) Field of Classification Search
CPC .................. H01L 26/42392; H01L 26/78642
See application file for complete search history.

(56) References Cited

U.S. PATENT DOCUMENTS

| 4,737,837 A | 4/1988 | Lee |
| 5,012,153 A | 4/1991 | Atkinson et al. |

(Continued)

FOREIGN PATENT DOCUMENTS

| CN | 105529356 A | 4/2016 |
| JP | 4137434 B2 | 8/2008 |
| JP | 4366525 B2 | 11/2009 |

OTHER PUBLICATIONS

Han et al., "The Device Made of Nothing—The vacuum transistor could one day replace traditional silicon," *IEEE Spectrum* 51(7):30-35, Jul. 2014.

(Continued)

*Primary Examiner* — Yu-Hsi D Sun
(74) *Attorney, Agent, or Firm* — Seed IP Law Group LLP

(57) ABSTRACT

A vacuum channel transistor having a vertical gate-all-around (GAA) architecture provides high performance for high-frequency applications, and features a small footprint compared with existing planar devices. The GAA vacuum channel transistor features stacked, tapered source and drain regions that are formed by notching a doped silicon pillar using a lateral oxidation process. A temporary support structure is provided for the pillar during formation of the vacuum channel. Performance of the GAA vacuum channel transistor can be tuned by replacing air in the channel with other gases such as helium, neon, or argon. A threshold voltage of the GAA vacuum channel transistor can be adjusted by altering dopant concentrations of the silicon pillar from which the source and drain regions are formed.

20 Claims, 15 Drawing Sheets

Related U.S. Application Data division of application No. 15/280,879, filed on Sep. 29, 2016, now Pat. No. 9,853,163.

(60) Provisional application No. 62/235,389, filed on Sep. 30, 2015.

(51) Int. Cl.
*H01L 29/66* (2006.01)
*H01J 21/10* (2006.01)

(56) References Cited

U.S. PATENT DOCUMENTS

| | | | |
|---|---|---|---|
| 5,077,597 | A | 12/1991 | Mishra |
| 5,389,796 | A | 2/1995 | Kang et al. |
| 5,977,693 | A | 11/1999 | Nakamoto et al. |
| 6,437,360 | B1 | 8/2002 | Cho et al. |
| 6,642,575 | B1 | 11/2003 | Ono et al. |
| 7,646,149 | B2 | 1/2010 | Naaman et al. |
| 8,159,119 | B2 | 4/2012 | Kim et al. |
| 8,378,415 | B2 | 2/2013 | Higashino |
| 9,029,211 | B2 | 5/2015 | Xiao |
| 9,117,875 | B2 | 8/2015 | Jacob et al. |
| 9,147,755 | B1 | 9/2015 | Han et al. |
| 9,331,189 | B2 | 5/2016 | Kim et al. |
| 9,385,195 | B1 | 7/2016 | Zhang |
| 9,793,395 | B1 | 10/2017 | Liu et al. |
| 9,853,163 | B2 | 12/2017 | Zhang |
| 2007/0045721 | A1 | 3/2007 | Forbes |
| 2009/0256208 | A1 | 10/2009 | Okano |
| 2010/0187601 | A1 | 7/2010 | Masuoka et al. |
| 2010/0203714 | A1 | 8/2010 | Masuoka et al. |
| 2010/0270611 | A1 | 10/2010 | Masuoka et al. |
| 2011/0042740 | A1 | 2/2011 | Masuoka et al. |
| 2011/0049532 | A1 | 3/2011 | Odekirk et al. |
| 2013/0153990 | A1 | 6/2013 | Lee et al. |
| 2013/0341596 | A1 | 12/2013 | Chang et al. |
| 2015/0035046 | A1 | 2/2015 | Kim et al. |
| 2015/0372104 | A1 | 12/2015 | Liu et al. |
| 2016/0087059 | A1 | 3/2016 | Hsieh et al. |
| 2016/0190312 | A1 | 6/2016 | Zhang et al. |
| 2016/0349208 | A1* | 12/2016 | Cao .............. G01N 33/48707 |
| 2017/0005106 | A1 | 1/2017 | Zhang |
| 2018/0102432 | A1 | 4/2018 | Liu et al. |
| 2018/0102433 | A1 | 4/2018 | Liu et al. |

OTHER PUBLICATIONS

Han et al., "Vacuum nanoelectronics: Back to the future?—Gate insulated nanoscale vacuum channel transistor," *Applied Physics Letters* 100:213505, 2012, 5 pages.

Ionescu et al., "Tunnel field-effect transistors as energy-efficient electronic switches," *Nature* 479:329-337, 2011.

Tanaka et al; "Bit Cost Scalable Technology with Punch and Plug Process for Ultra High Density Flash Memory," 2007 IEEE Symposium on VLSI Technology, Kyoto, Japan, Jun. 12-14, 2007, 2 pages.

Yano et al., "Short-Circuit Capability of SiC Buried-Gate Static Induction Transistors: Basic Mechanism and Impacts of Channel Width on Short-Circuit Performance," *IEEE Transactions on Electronic Devices* 57(4):919-927, Apr. 2010.

* cited by examiner

GATE ALL AROUND VACUUM CHANNEL TRANSISTOR

BACKGROUND

Technical Field

The present disclosure generally relates to implementations of transistors for use in high-speed, high-frequency integrated circuits and, in particular, to vacuum channel transistors.

Description of the Related Art

Vacuum channel transistors have been proposed as a solution to overcome performance limitations associated with conventional planar silicon metal-oxide-semiconductor field effect transistors (MOSFETs), for example, in U.S. Pat. No. 6,437,360 to Cho et al., and U.S. Pat. No. 8,159,119 to Kim et al. FIG. 1A provides a comparison of the basic structure of a conventional MOSFET 70 with that of an existing vacuum channel transistor 72 designed by NASA in collaboration with the National Nanofabrication Center of Korea [Applied Physics Letters, volume 100, published May 23, 2012]. The conventional MOSFET 70 shown on the left side of FIG. 1A includes a source 76, a drain 78, a gate 80, a channel 82, and a gate dielectric 84 formed on a semiconductor substrate. The conventional MOSFET 70 operates as follows: the source 76 and drain 78 are doped with positive or negative ions to provide reservoirs of charge. In response to a voltage applied to the gate 80, a current is induced to flow in the channel 82, thereby coupling the source 76 and the drain 78. The channel of the conventional MOSFET 70 lies between the doped source and drain regions and thus is made of the semiconductor material, typically silicon.

As current flows between the source 76 and the drain 78, the motion of electrons through the silicon crystal is impeded by the presence of silicon atoms and impurities in the crystal. In the conventional MOSFET 70, electrons can also experience scattering from acoustic phonons associated with the crystal lattice, among other sources. Consequently, increasing electron mobility has been a topic of great interest and activity in the semiconductor field for decades. Performance improvements for semiconductor channel devices have relied on influencing mechanical properties, e.g., strain, of the silicon lattice, for example, by introducing adjacent layers of different materials or by replacing portions of the silicon with epitaxially grown, and/or doped, crystalline material.

The vacuum channel transistor 72, like the conventional MOSFET 70, has a source 86, a drain 88, a gate 90, an air channel 92, and a gate dielectric 94 formed on a semiconductor substrate. However, the vacuum channel transistor 72 offers a different approach from that of the conventional MOSFET 70 in that the channel 92 does not include crystalline material. The structure of the vacuum channel transistor 72 is upside down, such that the gate is positioned below the source and drain terminals, and the air channel 92 is an open region between the source and drain. Furthermore, the source and drain 86, 88, respectively, are shaped with points to enhance electric fields during operation of the vacuum channel transistor 72. When the gate 90 is energized, a current flows between the source 86 and the drain 88 by thermionic emission, or "arcing." If the points of the source and drain 86, 88 are spaced closely enough to one another, the voltage required to cause thermionic emission that activates the device may be relatively small. The trajectory of emitted electrons may then be shorter than the distance between air molecules, permitting the electrons to travel ballistically through the air channel without being impeded by collisions. Such ballistic motion is effectively the same as that which would occur if the air channel 92 was evacuated. Thus, a vacuum channel transistor need not actually contain a vacuum, but may be filled with air, and the electrons will still travel substantially as fast as they would in a vacuum. Consequently, the velocity of electrons in the vacuum channel transistor 72 can be up to 1000 times faster than the velocity of electrons traversing a semiconductor channel, causing the vacuum channel transistor 72 to switch on and off fast enough to operate at frequencies in the range of 100 GHz to 1 Terahertz as illustrated in FIG. 1B [IEEE Spectrum, July 2014, p. 35]. Such a device has many potential applications, for example, in high-speed telecommunications.

BRIEF SUMMARY

A nanoscale vacuum channel transistor is implemented using a non-planar, vertical gate-all-around (GAA) architecture. The GAA vacuum channel transistor is a high performance, high-frequency device that also has a small footprint compared with existing planar devices. Aspects of vertical gate all-around devices having semiconductor channels have been disclosed previously in other patent documents by the present inventor [e.g., U.S. Patent Publication No. 2016/0190312, U.S. Pat. No. 9,385,195, and U.S. patent application Ser. No. 15/191,359]. The present vertical GAA vacuum channel transistor features stacked, tapered source and drain regions that are formed by notching a doped silicon pillar using a lateral oxidation process. A temporary support structure is provided for the pillar during formation of the vacuum channel. Performance of the GAA vacuum channel transistor can be tuned by replacing air in the channel, i.e., a mixture of oxygen and nitrogen, with other gases e.g., noble gases such as helium, neon, or argon. A threshold voltage of the GAA vacuum channel transistor can be adjusted by altering dopant concentrations of the silicon pillar from which the source and drain regions are formed.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale.

DETAILED DESCRIPTION

Figure 1A:
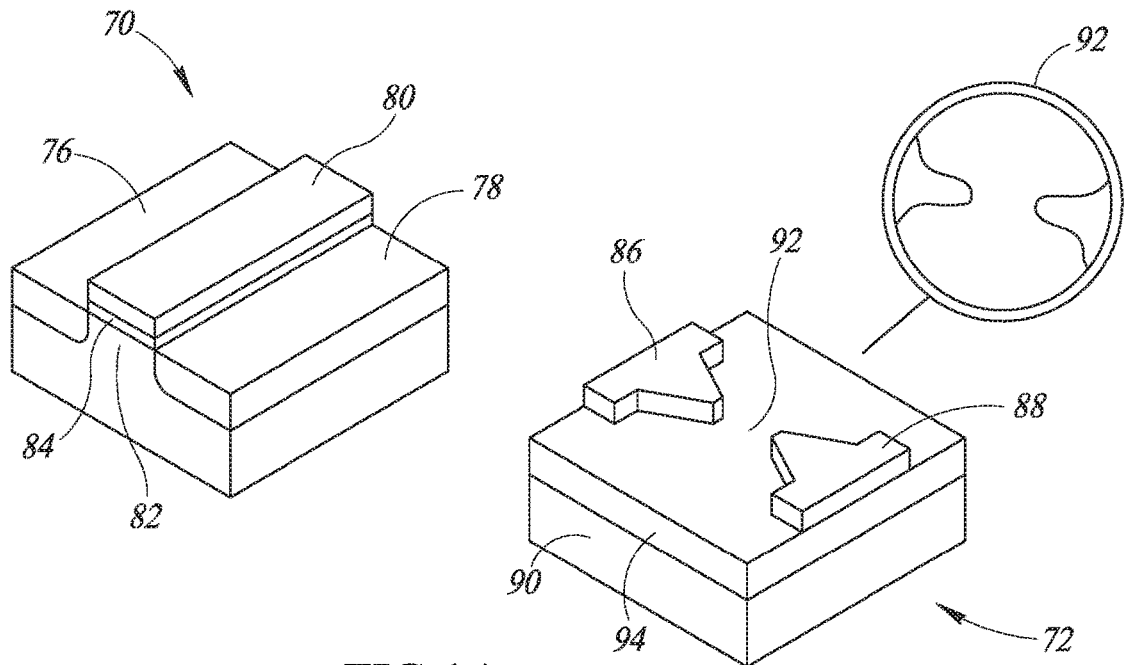
FIG. 1A is pictorial perspective view of a conventional MOSFET and a planar vacuum channel transistor, according to the prior art.
Figure 1B:
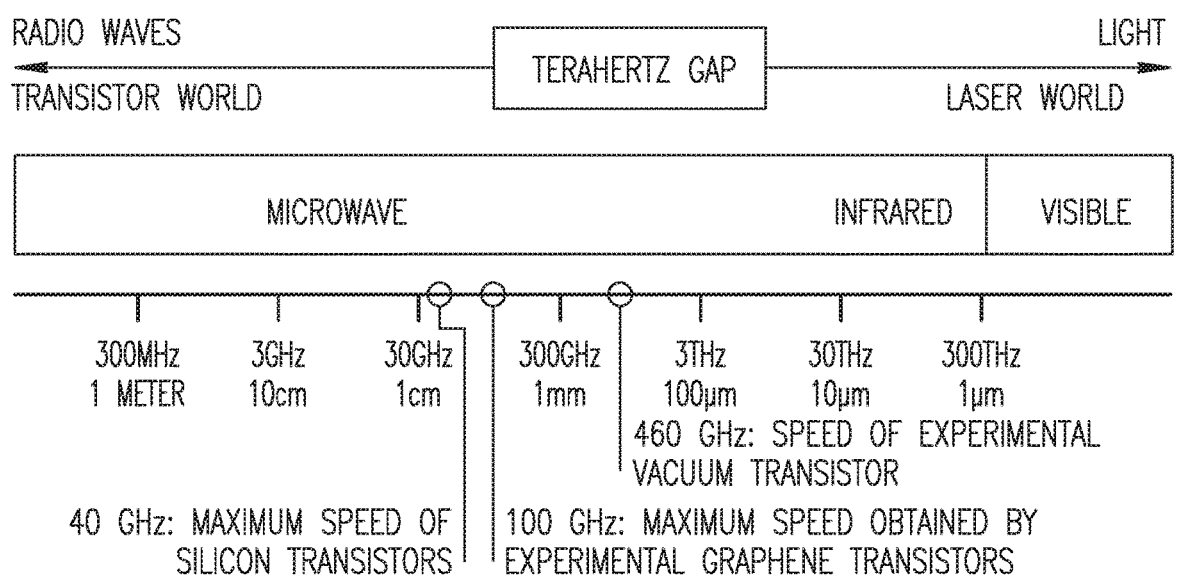
FIG. 1B is a table of frequencies associated with a variety of transistors.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected. Throughout the specification, the term "layer" is used in its broadest sense to include a thin film, a cap, or the like, and one layer may be composed of multiple sub-layers.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, includes a spin-expose-develop process sequence typically followed by an etch process. Alternatively or additionally, photoresist can also be used to pattern a hard mask (e.g., a silicon nitride hard mask), which, in turn, can be used to pattern an underlying film.

Reference throughout the specification to conventional etching techniques known in the art of semiconductor fabrication for selective removal of polysilicon, silicon nitride, silicon dioxide, metals, photoresist, polyimide, or similar materials includes such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to vacuum channel transistors that have been produced; however, the present disclosure and the reference to certain materials, dimensions, and the details and ordering of processing steps are exemplary and should not be limited to those shown.

Figure 2:
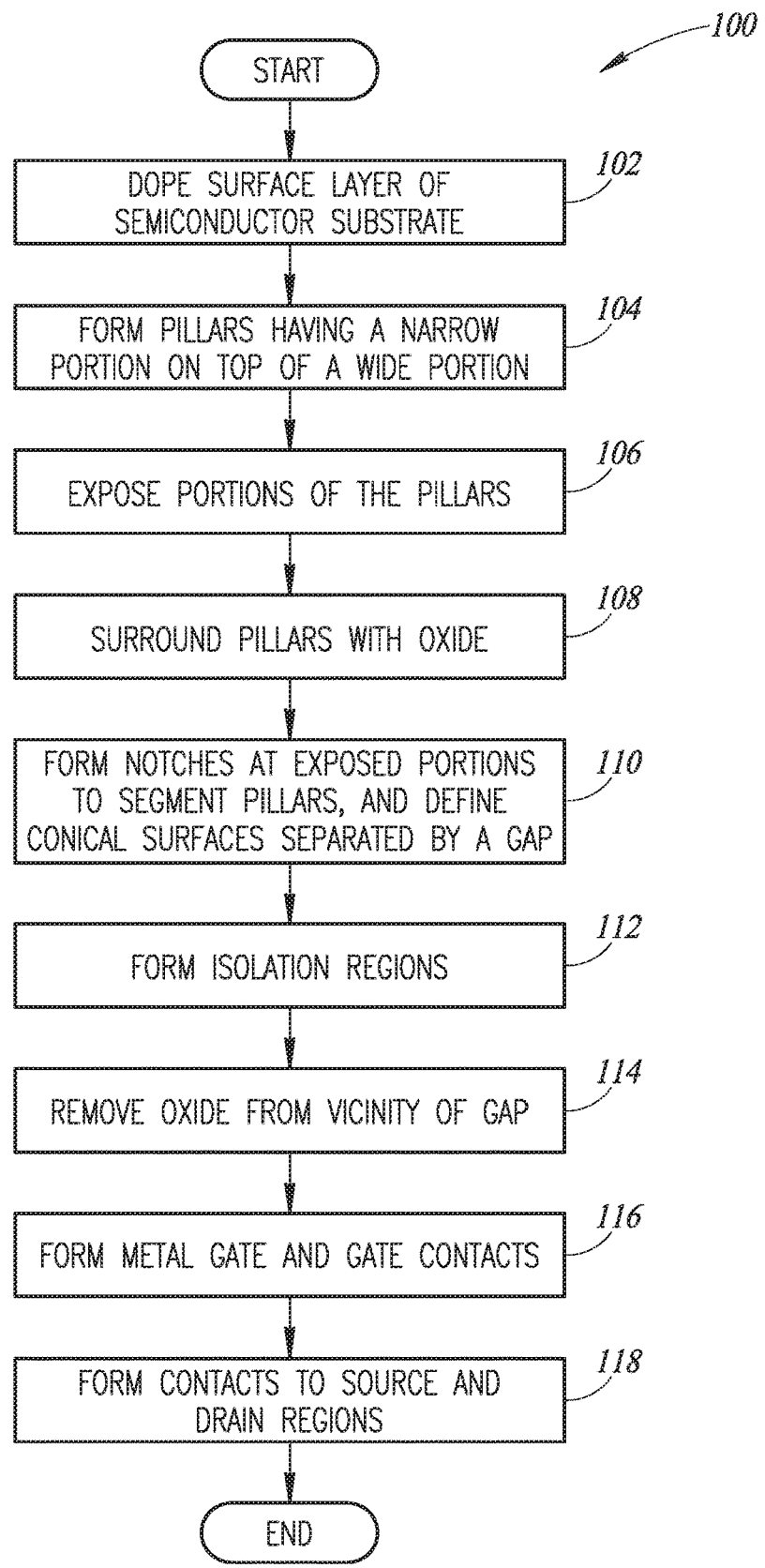
FIG. 2 is a flow diagram showing steps in a method of fabricating vertical gate-all-around vacuum channel transistors, according to one embodiment as described herein.

Turning now to the figures, FIG. 2 shows steps in a method of fabricating gate all-around vacuum channel transistors according to one embodiment. Steps in the method 100 are further illustrated by FIGS. 3-17B, and described below.

Figure 3:
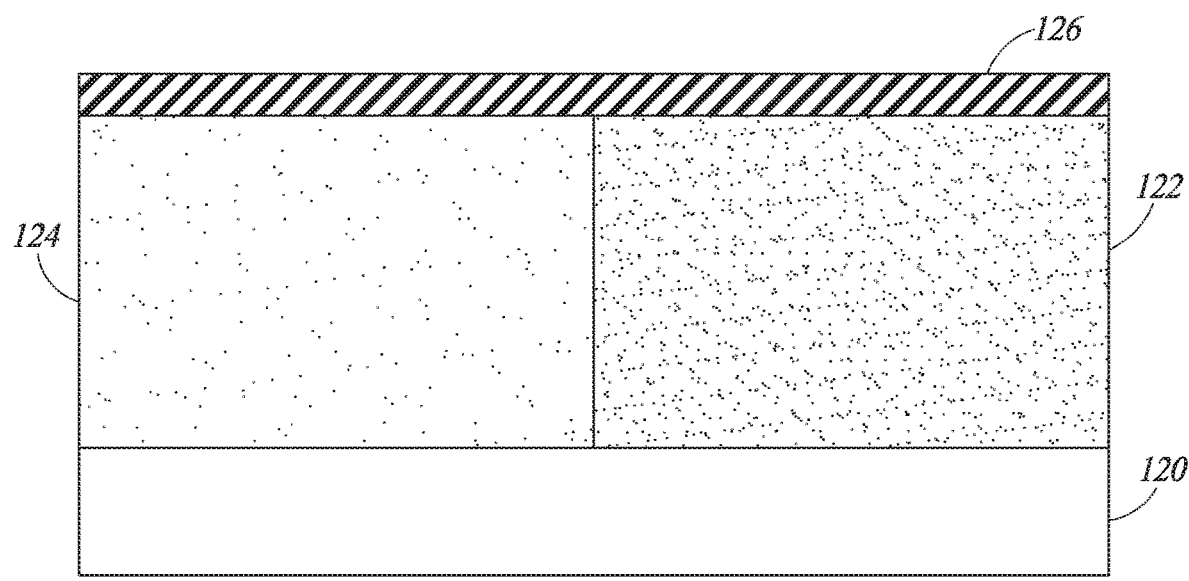
FIGS. 3-10 are cross-sectional views of a pair of gate-all-around vacuum channel transistors at successive steps of fabrication, according to one embodiment as described herein.

At 102, doped regions are formed on a surface layer of a semiconductor substrate 120 as shown in FIG. 3. The semiconductor substrate 120 is doped to form a first doped region 122 and a second doped region 124. Doping can be carried out, for example, by conventional ion implantation, as is well known in the art. The first and second doped regions 122, 124, respectively can have opposite polarity or the same polarity with different ion concentrations. In one embodiment, the first doped region 122 is doped with positive ions, e.g., boron, and the second doped region 124 is doped with negative ions, e.g., arsenic or phosphorous, to a concentration within the range of about 1.0 E 19-1.0 E 21, with a target concentration of 5.0 E 20. The dopant concentration of the doped regions 122, 124 can be used to tune a threshold voltage, $v_T$, of the vacuum channel transistors. The target depth of the doped regions 122, 124 can be anywhere in the range of about 40-400 nm.

Figure 4:
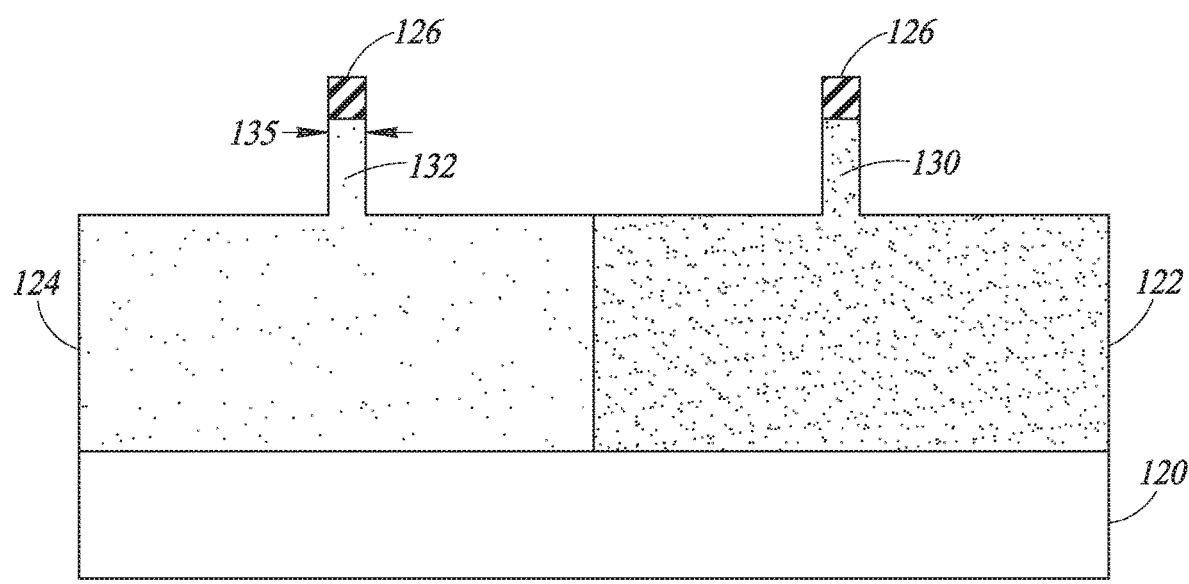
Figure 5:
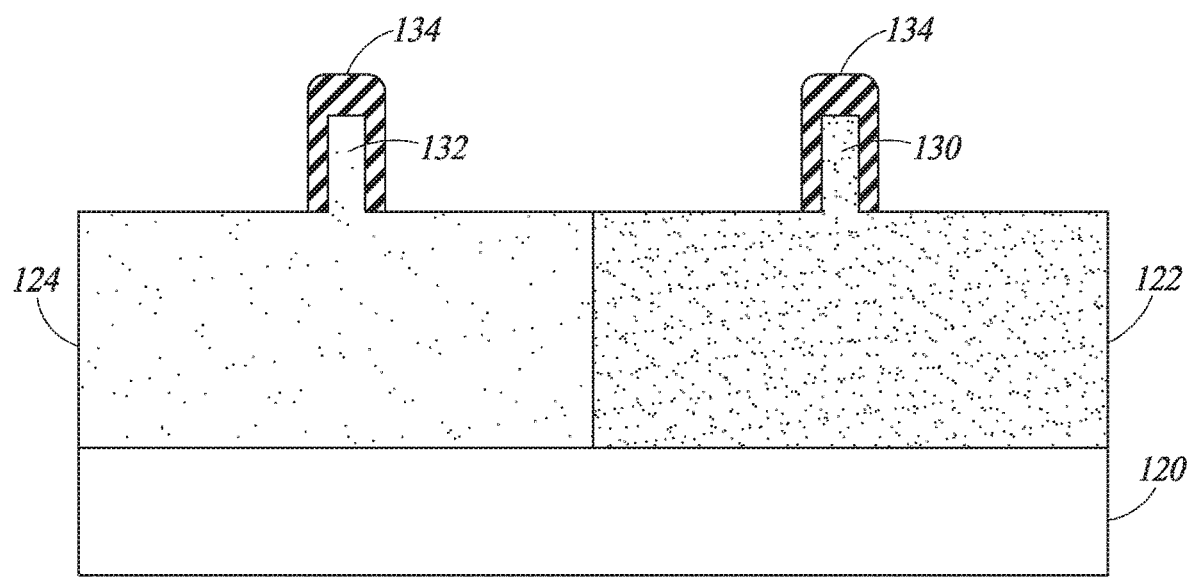
Figure 6:
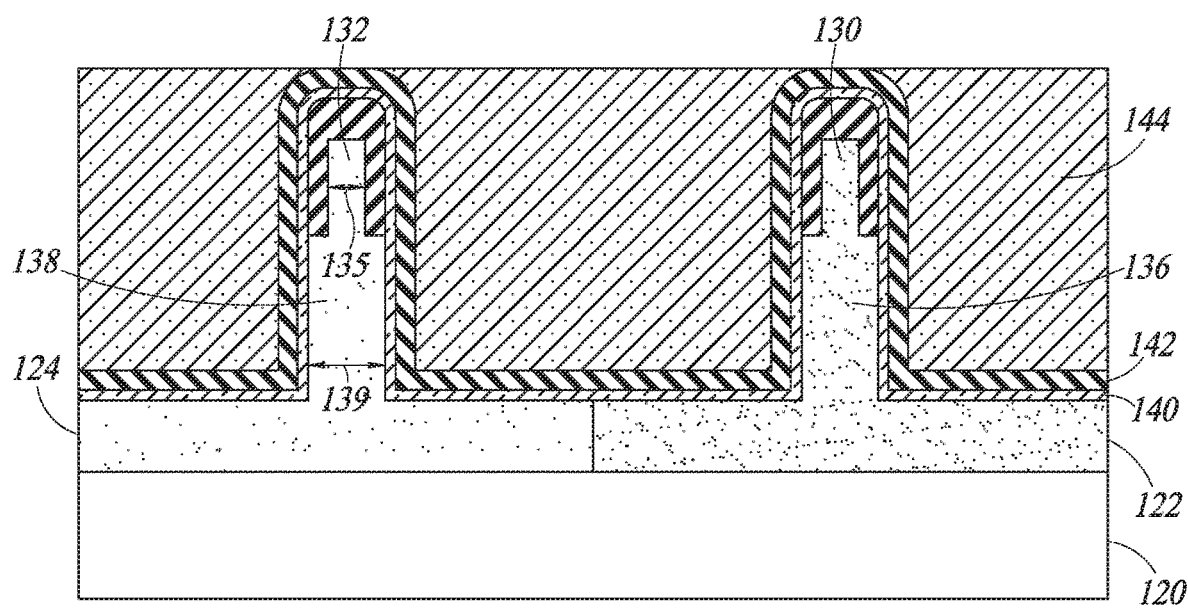

At 104, vertical pillars are formed from the doped regions, according to one embodiment as shown in FIGS. 3-6. The vertical pillars have narrow portions 130, 132 on top of wide portions 136, 138, as shown in FIG. 6.

First, a hard mask 126 is deposited on the doped regions 122, 124 as shown in FIG. 3. The hard mask 126 is desirably made of silicon nitride (SiN) and is about 40 nm thick. The hard mask 126 is then patterned in the usual way, using a reactive ion etch (RIE) process to form the narrow portions 130, 132 of the vertical pillars, the narrow portions having narrow pillar widths 135 in the range of about 10-100 nm as shown in FIG. 4. After forming the narrow portions 130, 132, the hard mask 126 remains on the tops of the vertical pillars.

A SiN spacer 134 is then formed over the narrow portions 130, 132 of the vertical pillars, according to one embodiment as shown in FIG. 5. A SiN film is conformally deposited over the doped regions 122, 124 and the narrow portions 130, 132. The SiN film desirably has a thickness in the range of about 2-20 nm. The SiN film is then etched anisotropically, in a downward direction to remove SiN from a top surface of the doped regions 122, 124, leaving behind a SiN spacer 134 covering the sidewalls and tops of the narrow portions 130. The doped regions 122, 124 are then etched again using the SiN spacer 134 as a mask to form wide portions 136, 138 of the vertical pillars underneath the narrow portions 130, 132. The wide portions 136, 138 have wide pillar widths 139 in the range of about 10-150 nm.

Next, a silicon oxide layer 140, e.g., $SiO_2$, and a SiN layer 142 are conformally deposited over the vertical pillars, in succession. Both the oxide layer 140 and the SiN layer 142 desirably have thicknesses in the range of about 2-20 nm, which can be achieved, for example, using an atomic layer deposition (ALD) process. Next, the vertical pillars are encapsulated by spin-coating a layer of an encapsulant 144 such as, for example, benzocyclobutene (BCB). The encapsulant 144 is a polymer, similar to polyimide or a spin-on glass material. The encapsulant 144 is then planarized using a CMP process that stops on the SiN layer 142, as shown in FIG. 6.

Figure 7:
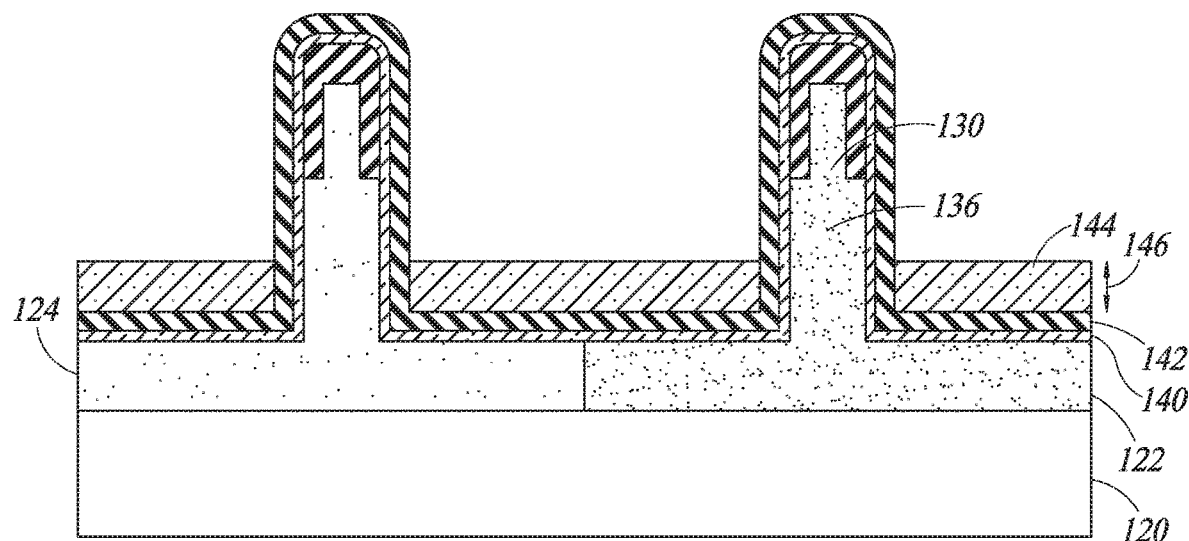
Figure 8:
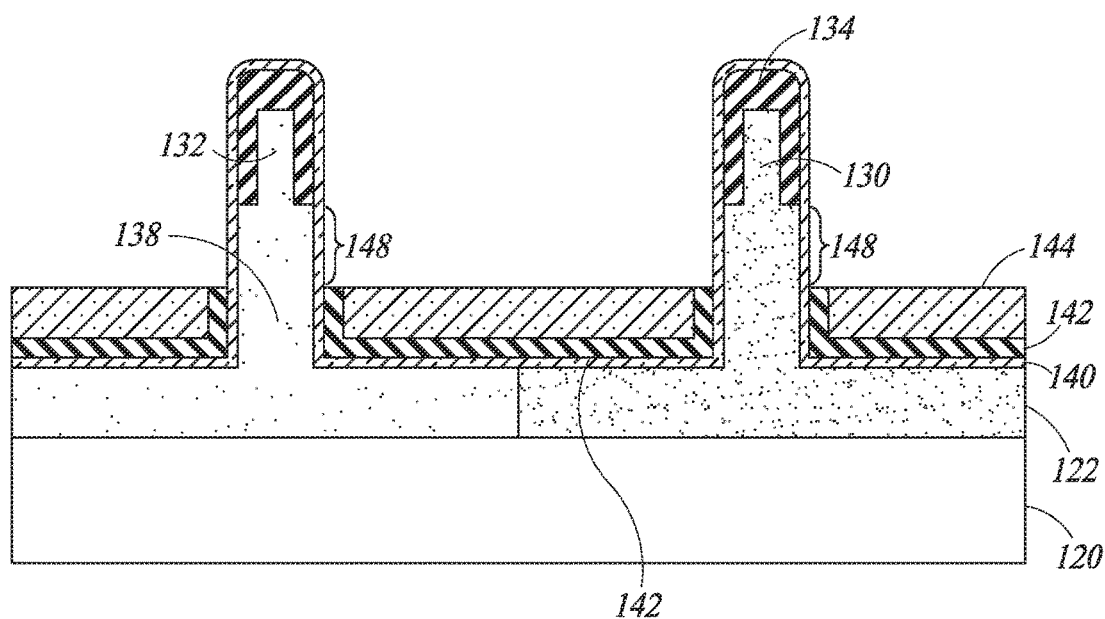
Figure 9:
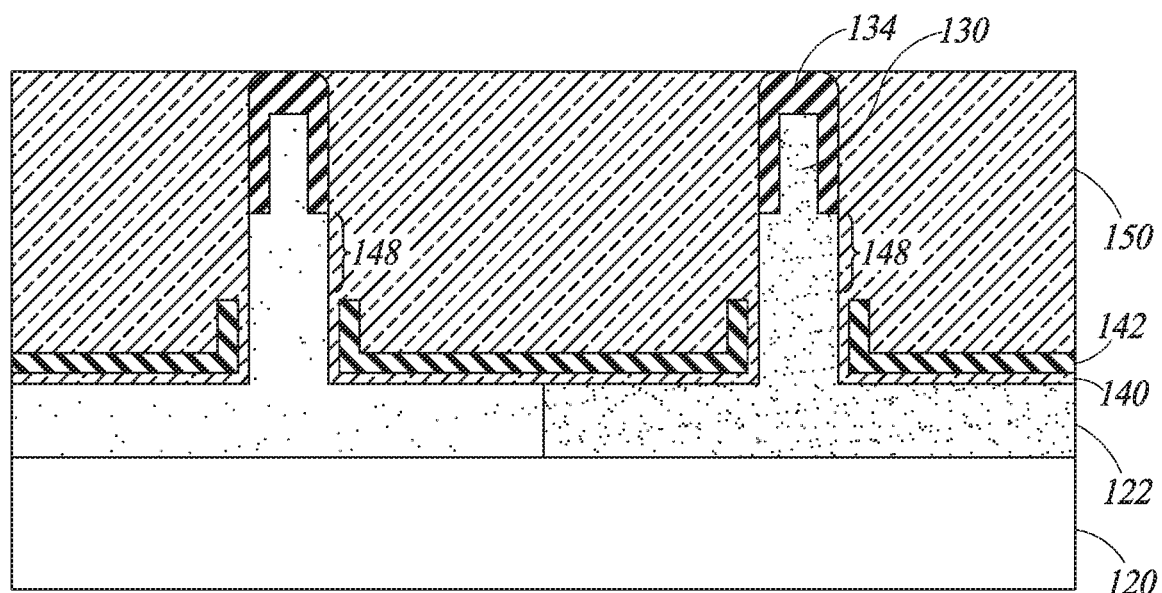

At 106, the vertical pillars are partially exposed, according to one embodiment as shown in FIGS. 7-9. First, the encapsulant 144 is etched back to a recessed thickness 146 using, for example, a plasma etching process having an oxygen/sulfur hexafluoride ($O_2/SF_6$) chemistry, thus revealing the top 100-900 nm of the vertical pillars. The remaining recessed thickness 146 of the encapsulant 144 is in the range of about 10-50 nm, as shown in FIG. 7. Exposed portions of the SiN layer 142 are then etched away, selective to the oxide layer 140 and the encapsulant 144, as shown in FIG. 8. Exposed portions of the oxide layer 140 are then removed, selective to the underlying doped silicon regions 122, 124, SiN, and the encapsulant 144. Next, the encapsulant 144 is stripped using a plasma etch chemistry that removes polymer, selective to SiN, silicon, and $SiO_2$. Stripping the encapsulant 144 thus partially exposes gate regions 148 of the wide portions 136, 138 of the vertical pillars, as shown in FIG. 9. The exposed gate regions 148 are desirably about 5-20 nm in height.

At 108, the vertical pillars are surrounded by a thick oxide layer 150, as shown in FIG. 9. The thick oxide layer 150 is then planarized down to the tops of the SiN spacers 134. The thick oxide layer 150 is desirably several hundred nm thick.

Figure 10:
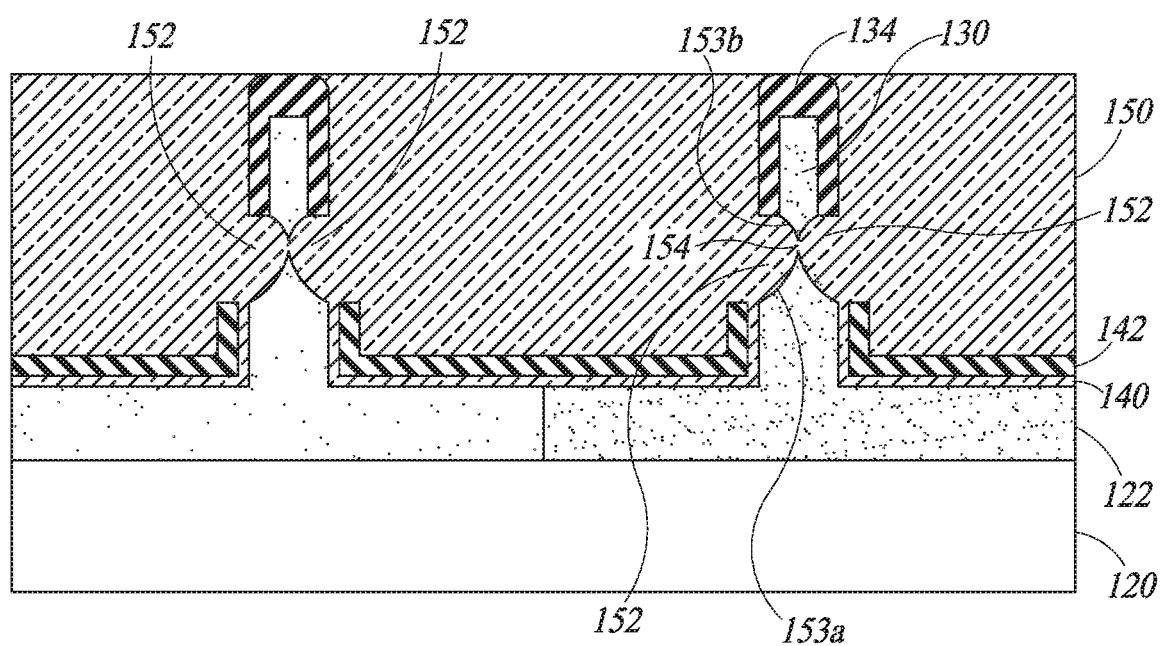

At 110, notches 152 are formed at the exposed gate regions 148 to segment the vertical pillars into two pillar pairs 136, 138 and 130, 132, according to one embodiment as shown in FIG. 10. To form the notches 152, the thick oxide layer 150 is annealed at a temperature of about 1000 C, causing oxidation of exposed gate regions 148 of the silicon pillars. The notches 152, thus formed, define surfaces 153a, 153b shaped generally as pointed tips that are separated by gaps 154. In the embodiment shown, the surfaces 153a,b are generally conical in shape. In one embodiment, the gaps 154 are less than 10 nm wide. The sharpness of the tips will determine how thermionic emission occurs. The precise shape and sharpness of the tips varies according to process parameters of the oxidation annealing process such as, for example, how fast the temperature changes during the annealing process, the length of the annealing step, and dopant concentrations of the vertical pillars. The shape of the conical surfaces 153a, 153b will therefore vary from process to process and might not be a cone. The shape is based on how a grown oxide encroaches into a silicon layer from which it is grown. For many years, field oxide, known as FOX, was grown in silicon to form the isolation regions between transistors. Such grown field oxide regions were curved at the very tips with a bird's beak at the end and, since a similar process is at work here, the shapes of the remaining pillar pairs 130, 138 and 132, 136 will vary from one process to another, but will be generally conical in shape in most process flows. An example of curved oxide surfaces that approximate a cone are shown in FIG. 10, while more idealized conical shapes are shown in the cross-sectional views presented thereafter in FIGS. 11B, 12B, 12D, 13B, and so on. Many such factors therefore may influence performance of the GAA vacuum transistors.

In each of the FIGS. 11A-17B, A represents a top plan view of the GAA vacuum transistors at the present step during fabrication, showing a line B-B, indicating cut lines for a cross-sectional view; B represents a cross-sectional view along the cut line B-B through the GAA transistor.

Figure 11A:
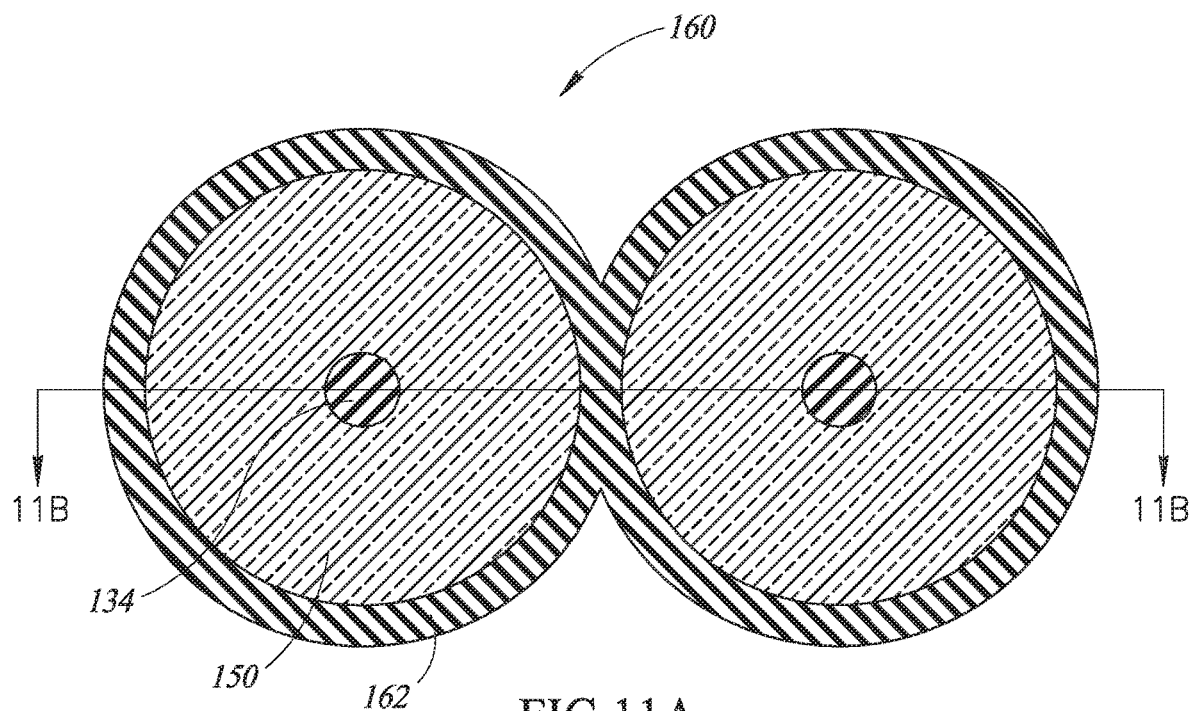
FIGS. 11A-11B, 12A-12D, 13A-13B, are top plan and cross-sectional views of gate-all-around vacuum channel transistors during fabrication of vacuum channels and isolation regions according to one embodiment as described herein.
Figure 11B:
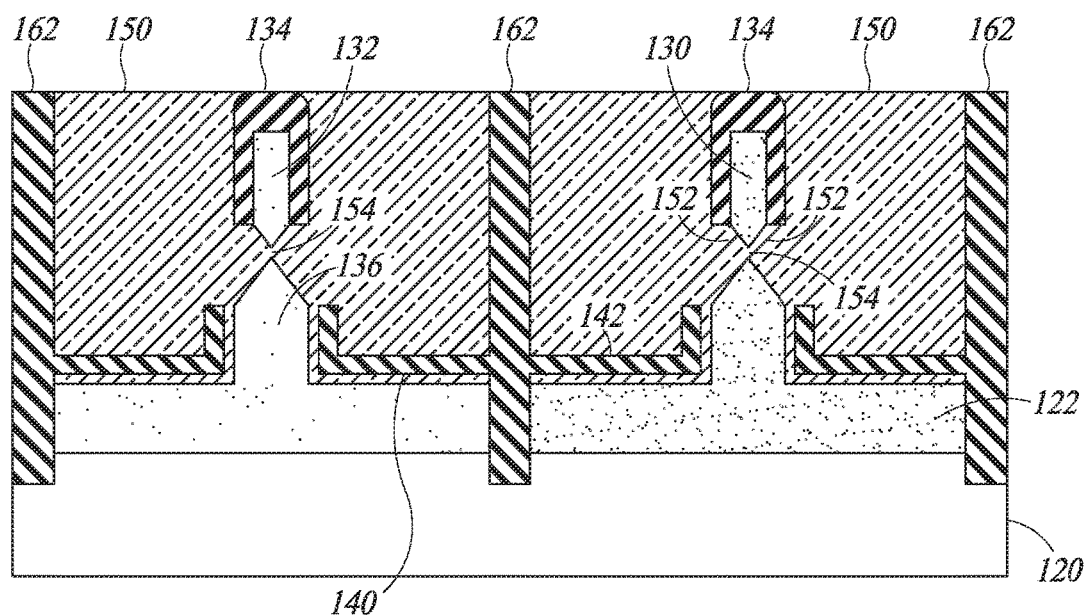

At 112, isolation regions 162 are formed, according to one embodiment as shown in FIGS. 11A, 11B. The isolation regions 162 separate adjacent GAA transistors from one another and from neighboring circuitry. The isolation regions 162 are formed in the usual way by etching trenches into the semiconductor substrate 120 and filling the trenches with an insulating material, e.g., $SiO_2$. The isolation regions 162 as shown in a top plan view 160 (FIG. 11A) can be laid out in circular patterns. Alternatively, the isolation regions 162 can be laid out in square patterns, or any other shape. Alternatively, the isolation region 162 that extends into the substrate can be formed at step 102 or at step 106, and the thick oxide 150 can be the primary or sole insulation material separating the transistors at the pillar region.

Figure 12A:
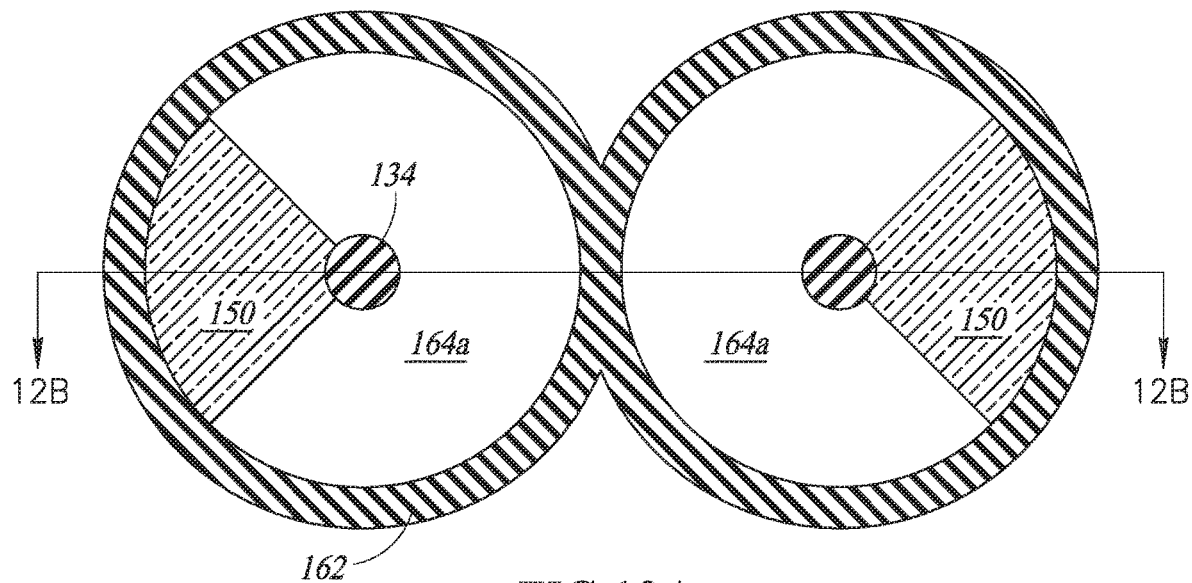
Figure 12B:
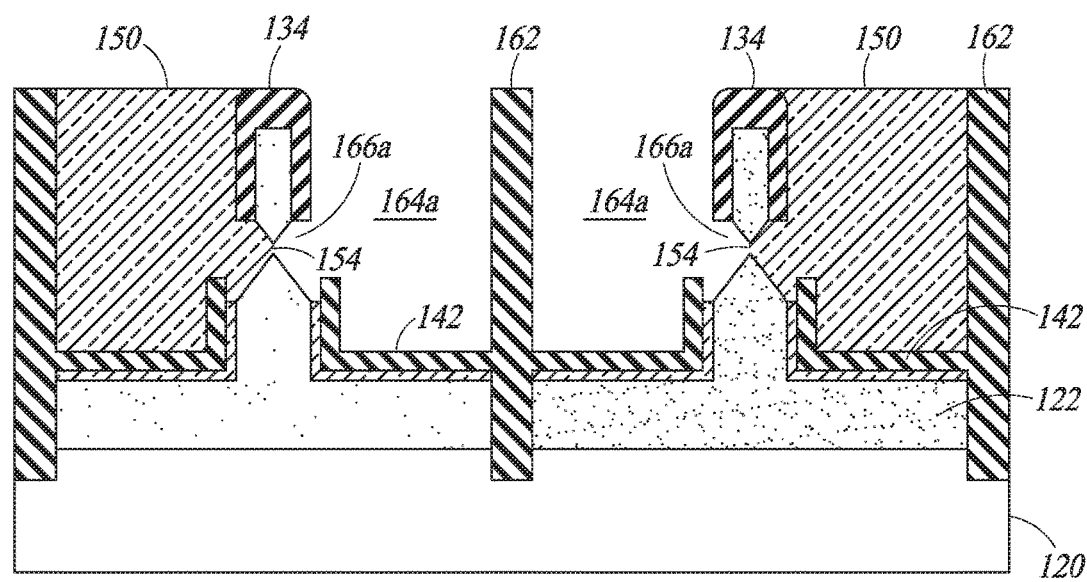

At 114, a four-step process is used to create high quality vacuum channels, according to one embodiment, as shown in FIGS. 12A-13B. First, portions of the thick oxide layer 150 are removed from the channel region, in the vicinity of the gaps 154, as shown in FIGS. 12A and 12B. To accomplish this, a SiN blocking mask, about 40 nm thick, is deposited and patterned so as to expose inner portions of the thick oxide layer 150 to be removed. The thick oxide layer 150 is then exposed to an etchant such as, for example, hydrofluoric acid (HF) to create large recesses referred to herein as recessed oxide regions 164a. At the same time, the etchant removes oxide from the notched areas around the gaps 154 to form voids 166a adjacent to the large recessed oxide regions 164a. The voids 166a can be thought of as larger gaps in the oxide adjacent to the vertical pillars. Meanwhile, the remaining thick oxide layer 150 and the isolation regions 162 adjacent to the thick oxide layer 150 provide temporary structural support by bracing the vertical pillars during and after formation of the recessed oxide regions 164a, 164b.

Following creation of the voids 166a, the thick oxide layer 150 is replaced in the recessed oxide regions 164a using a directional deposition, such as a gas cluster ion beam (GCIB) silicon oxide deposition. A directional deposition process fills the recessed oxide regions 164a from the bottom up, to create a replacement thick oxide layer 151 without depositing material laterally into the voids 166a. The voids 166a may be filled with a gas, which includes a first step in the directional deposition process that exposes the voids 166a to a gas in the deposition chamber such as, for example, helium, neon, argon, or the like. Whether the voids 166a are filled with gas, and which gas is used to fill the voids 166a, and therefore also to fill the gap 154 where the arcing occurs, directly affects mobility of charge through the vacuum channels. Adjusting the charge mobility in this way thereby tunes performance of the GAA vacuum channel transistors. In one or more subsequent steps in the directional deposition process, the voids 166a are sealed by a final directional deposition of the replacement thick oxide layer 151, as shown in FIG. 12D.

Figure 12C:
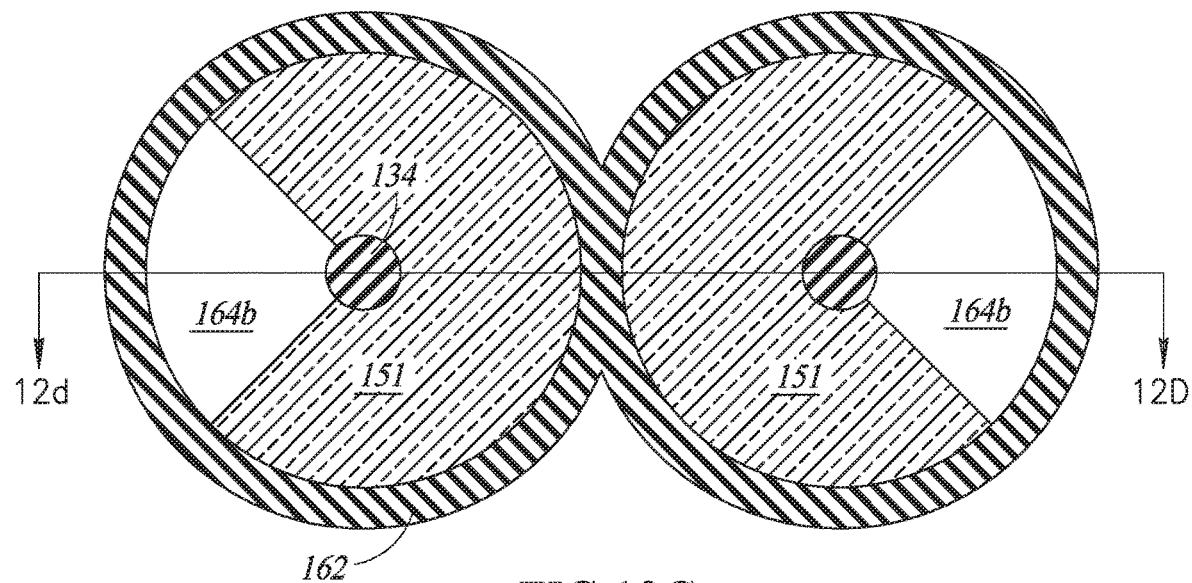
Figure 12D:
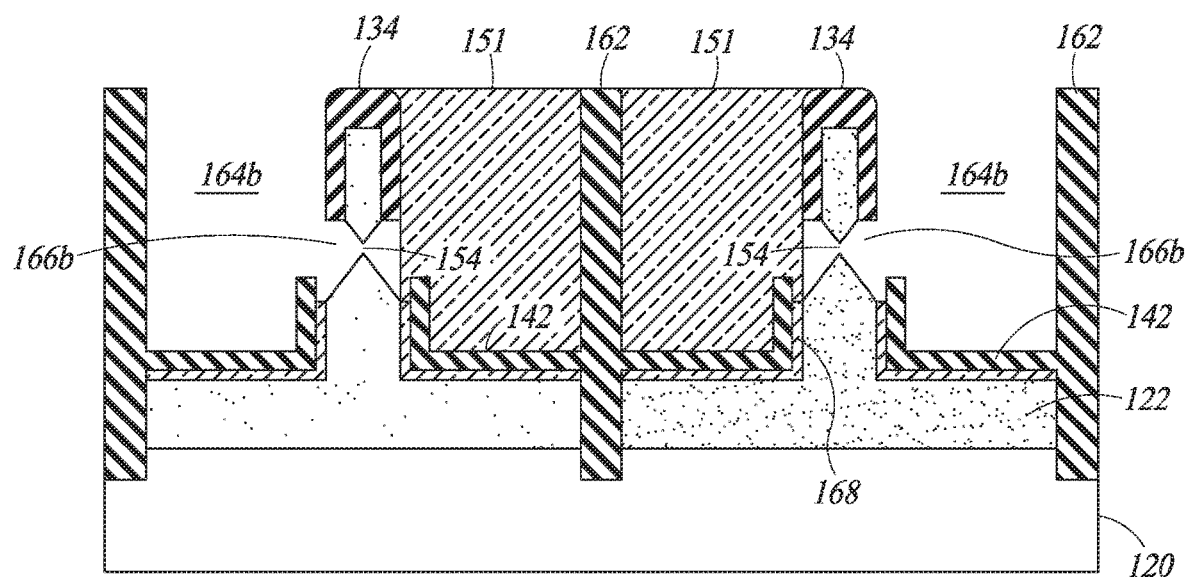
Figure 13A:
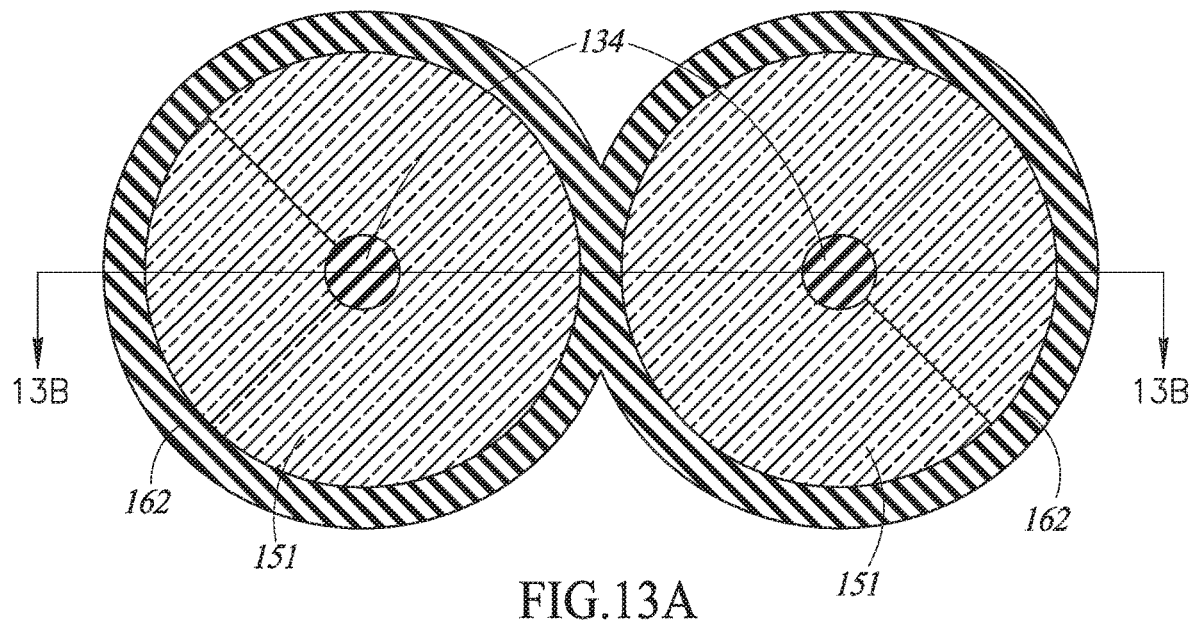
Figure 13B:
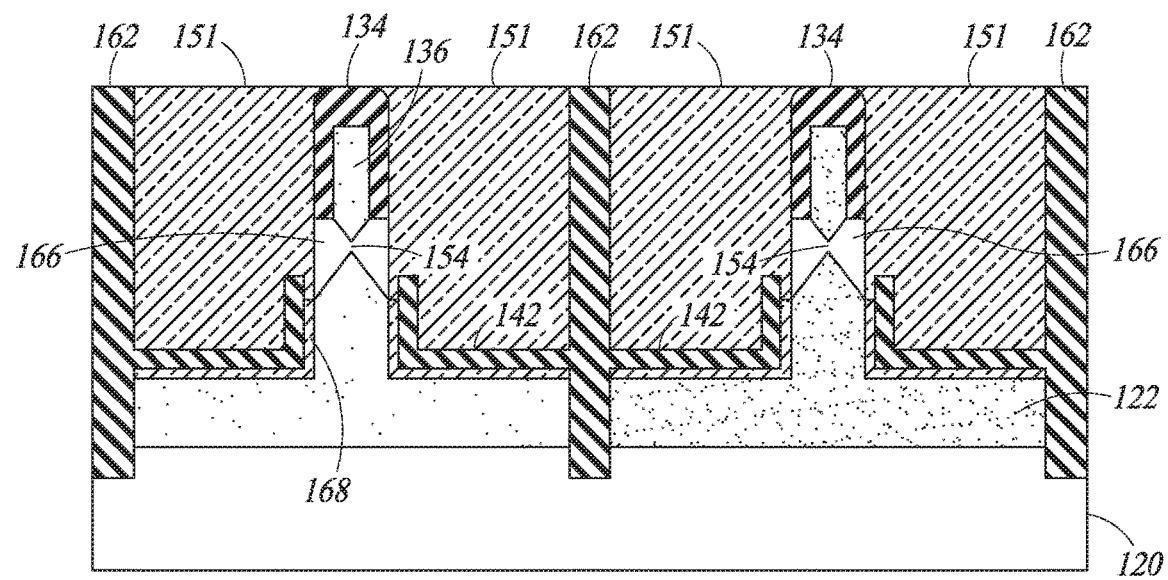

FIG. 12D illustrates the GAA vacuum channel transistors after three more steps in creating the vacuum channels have been completed—creation of the voids 166a, directional deposition to replace the thick oxide layer 150 and the creation of voids 166b. The steps of FIG. 12B have been repeated on opposite sides of the vertical pillars to create recessed oxide regions 164b and voids 166b. This is followed by directional deposition to replace the thick oxide layer 150 adjacent to the voids 166b which is shown in FIGS. 13A and 13B. It is noted that the recessed oxide regions 164a, 164b are not necessarily similar in size, as shown in the top plan views in FIGS. 12A and 12C. For example, in the embodiment shown, the recessed oxide regions 164a are about three times larger than the recessed oxide regions 164b. A first one of the recessed regions 164a is larger than a second one of the recessed regions 164b.

Figure 14A:
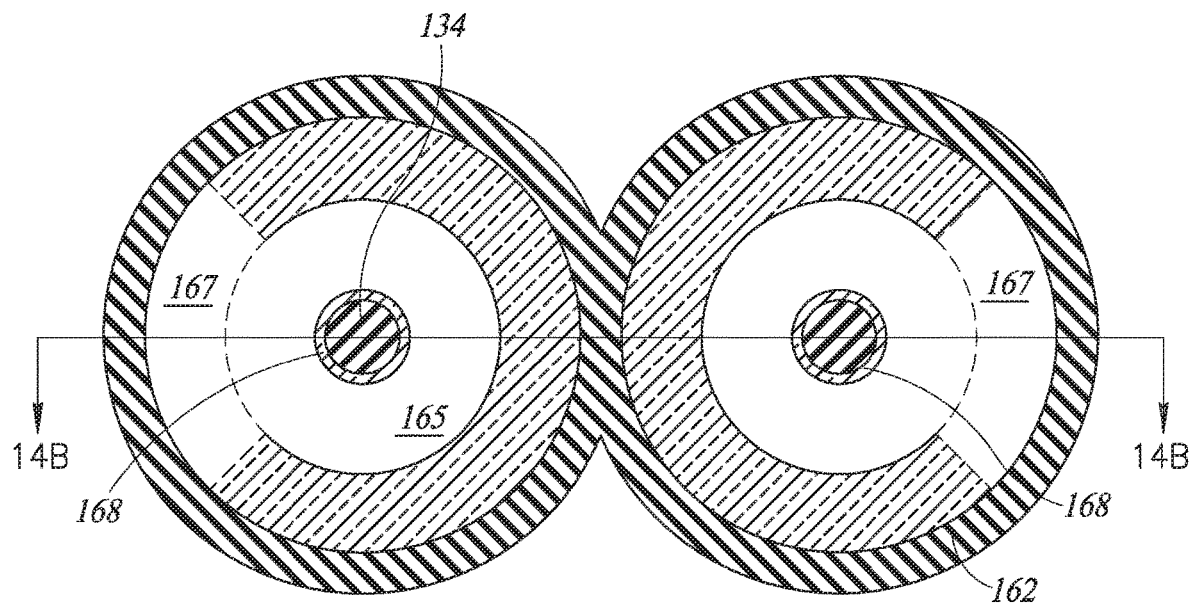
FIGS. 14A-14B, 15A-15B, 16A-16B are top plan and cross-sectional views of gate-all-around vacuum channel transistors during fabrication of metal gates and gate contacts, according to one embodiment as described herein.
Figure 14B:
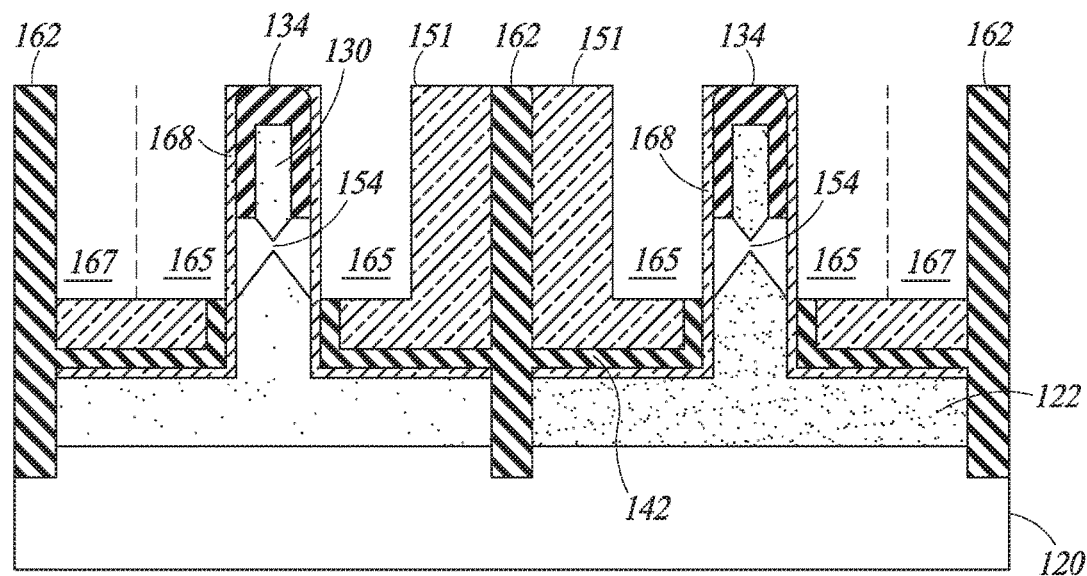

At 116, wrap-around gate structures 170 and front side gate contacts 176 are formed in the gate regions around the vertical pillars, according to one embodiment as shown in FIGS. 14A-15B. Each gate structure 170 includes a gate dielectric 172, and a conductive gate 174 that may include multiple layers. The conductive gate may be metal. The gate structures 170 are defined by annular trenches 165 formed in the replacement thick oxide layer 151, as shown in FIGS. 14A, 14B. The annular trenches 165 can be formed by a conventional etching process using either a photoresist mask or a SiN hard mask. The annular trenches 165 extend downward to the SiN layer 142. Contact trenches 167 expand the widths of the annular trenches 165 to provide L-shaped contact paths to the gates 174. The annular trenches 165 are spaced apart from the vertical pillars by an oxide spacer portion 168 of the replacement thick oxide layer 151, which oxide spacer portion 168 is retained during formation of the annular trenches 165. The gate structures 170 are formed in the lower regions of the annular trenches 165, so as to align with the gaps 154 that act as vacuum channels.

Figure 15A:
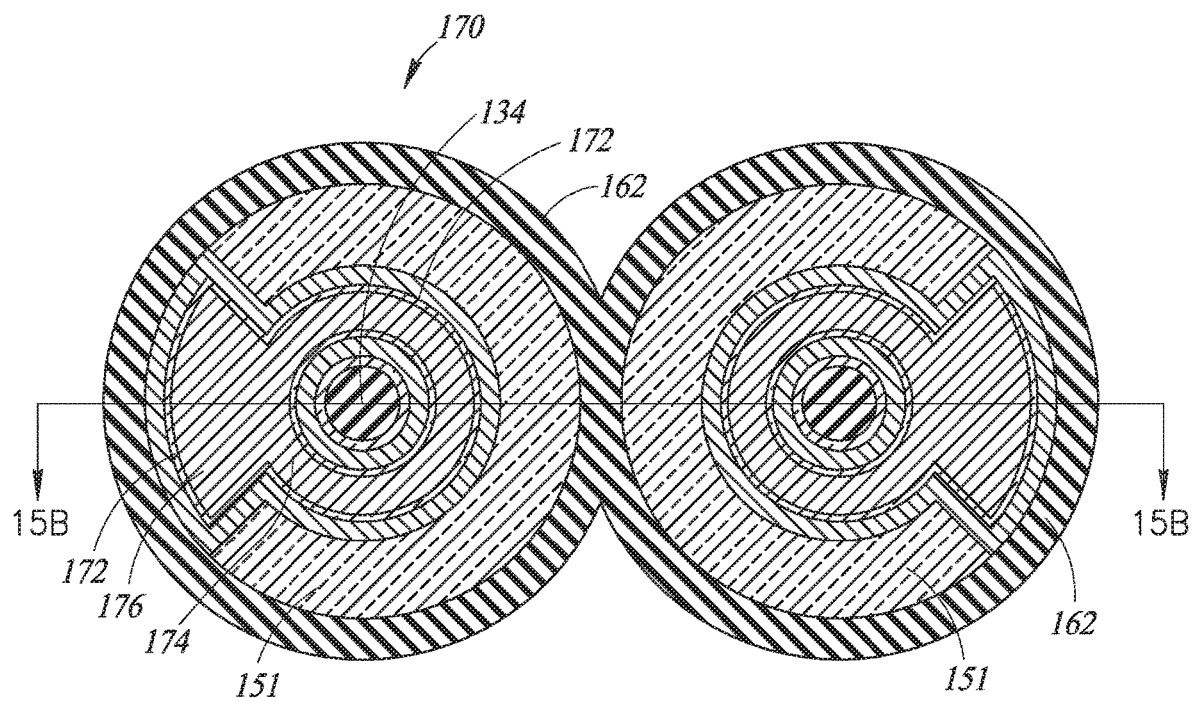
Figure 15B:
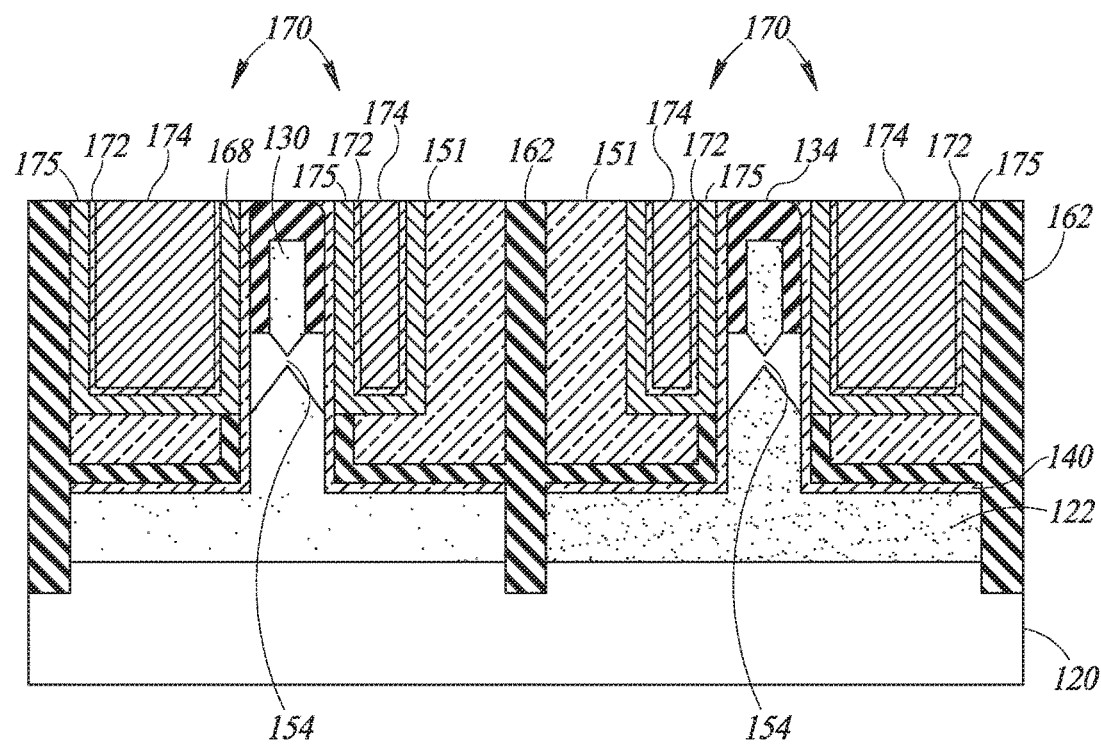

The annular trenches 165 and contact trenches 167 are then filled to form the gate structures 170 and the front side gate contacts 176, according to one embodiment as shown in FIGS. 15A-17B. First, the gate dielectric 172 is conformally deposited. The gate dielectric 172 is made of an oxide such as silicon dioxide ($SiO_2$) or a high-k dielectric material such as, for example, halfnium oxide ($HfO_2$), as is well known in the art. The gates 174 may include liners 175, e.g., titanium nitride (TiN), and/or one or more work function metals such as, for example, TiN or titanium carbide (TiC). The bulk of the gates 174 may be made of tungsten (W). Initially, the annular trenches 165 and contact trenches 167 are filled and planarized to stop on the SiN spacers 134, as shown in FIGS. 15A, 15B.

Figure 16A:
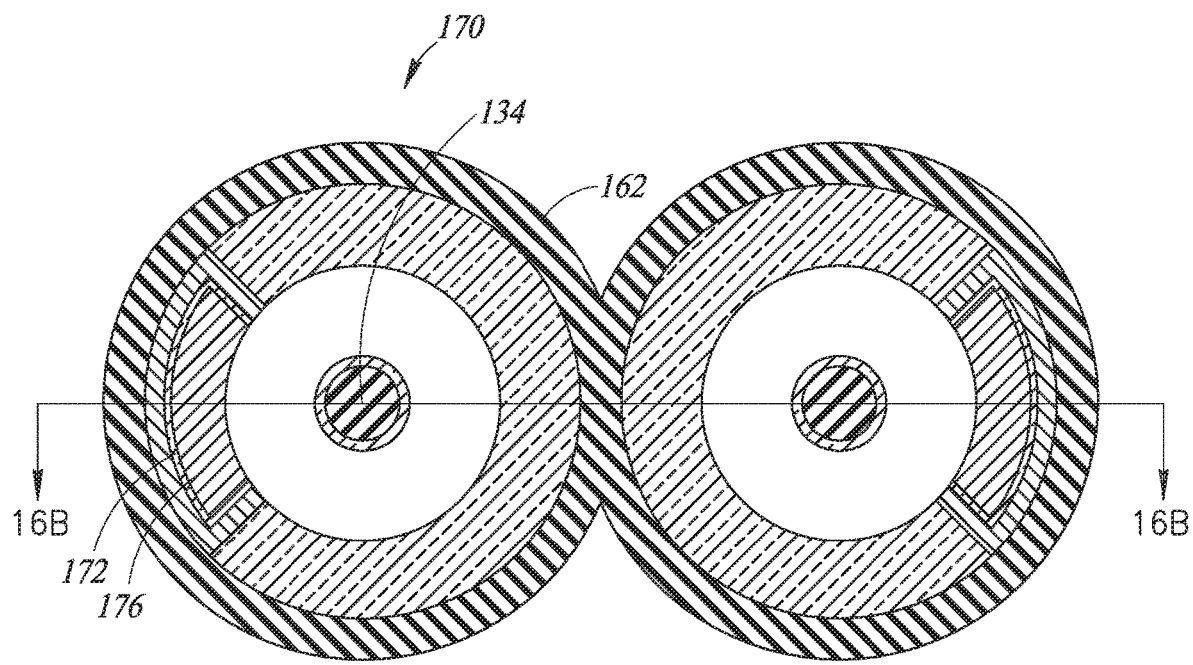
Figure 16B:
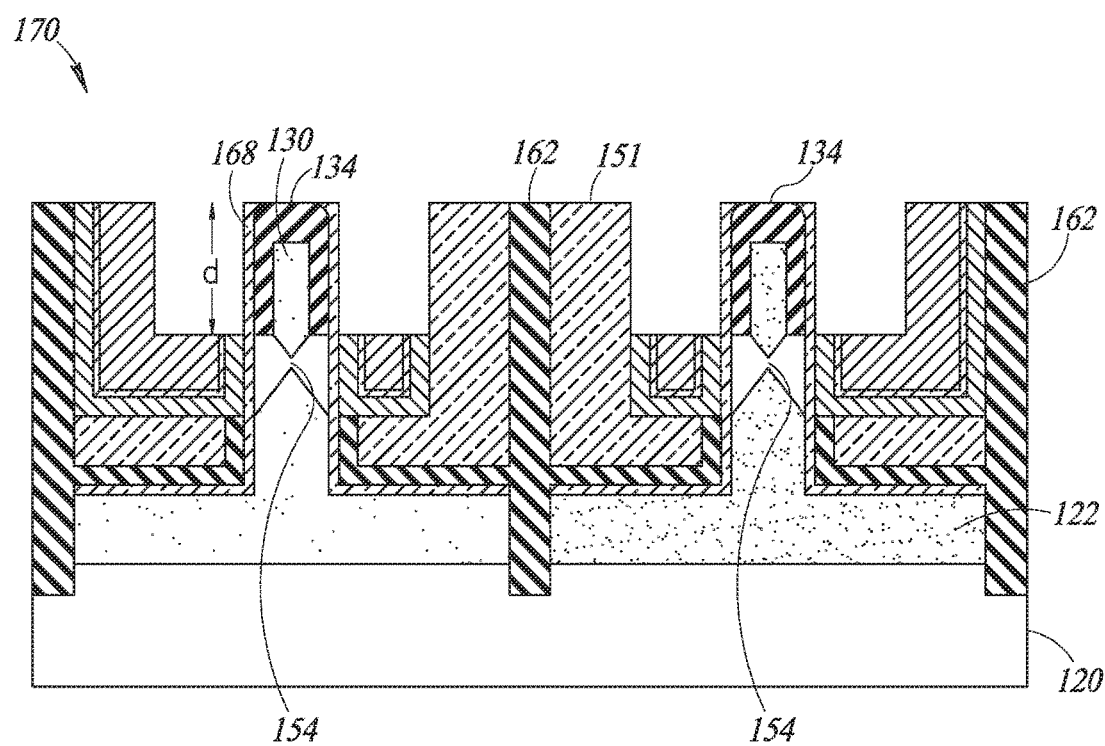

Next, the conductive gate material and the gate dielectric material within the annular trenches 165 are recessed by etching to a distance d, so that the gate structures 170 will be substantially aligned with the voids 166a, 166b, and approximately centered on the gaps 154. The gate structures thus form conductive rings around the central notched portions of the vertical pillars. Meanwhile, material within the contact trenches 167 is masked so that the gate contacts 176 will not be recessed, as shown in FIGS. 16A, 16B.

At 118, front side source and drain contacts 178 and 180, respectively, are formed according to one embodiment, as shown in FIGS. 17A, 17B, and 18A, 18B. First, the recessed areas above the gate structures 170 are re-filled with $SiO_2$ to restore the replacement thick oxide layer 151. Next, deep openings are formed in the replacement thick oxide layer 151 adjacent to the isolation regions 162. Also, shallow openings are formed in cap portions of the SiN spacers 134 on top of the vertical pillars. The openings can be made by a conventional wet or dry etching process using a photoresist mask, for example. Finally, the deep openings are filled with a conductive material, such a as a metal, to form the source contacts 178 to the doped regions 122, 124. Likewise, the shallow openings are filled with a conductive material to form the drain contacts 180 to the narrow portions 130, 132 of the vertical pillars. The narrow portions 130, 132 are the drain regions of the vertical GAA vacuum transistors. It is noted that other designs for contacts to the gate, source, and drain terminals of the GAA vacuum channel transistors may be used, for example, back side contacts, or a combination of some front side contacts and some back side contacts. Alternatively, an implementation of radial contacts that differs from the example shown herein may be used.

Figure 17A:
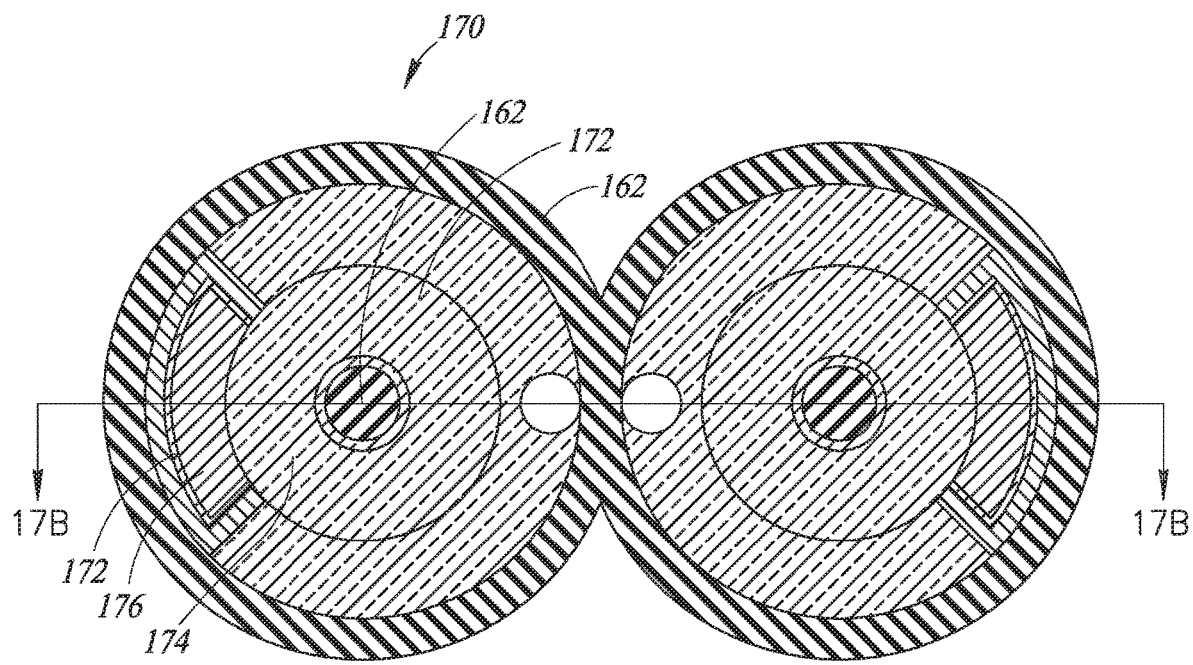
FIGS. 17A and 18A are top plan views of gate-all-around vacuum channel transistors during fabrication of source and drain contacts, according to one embodiment as described herein.
Figure 17B:
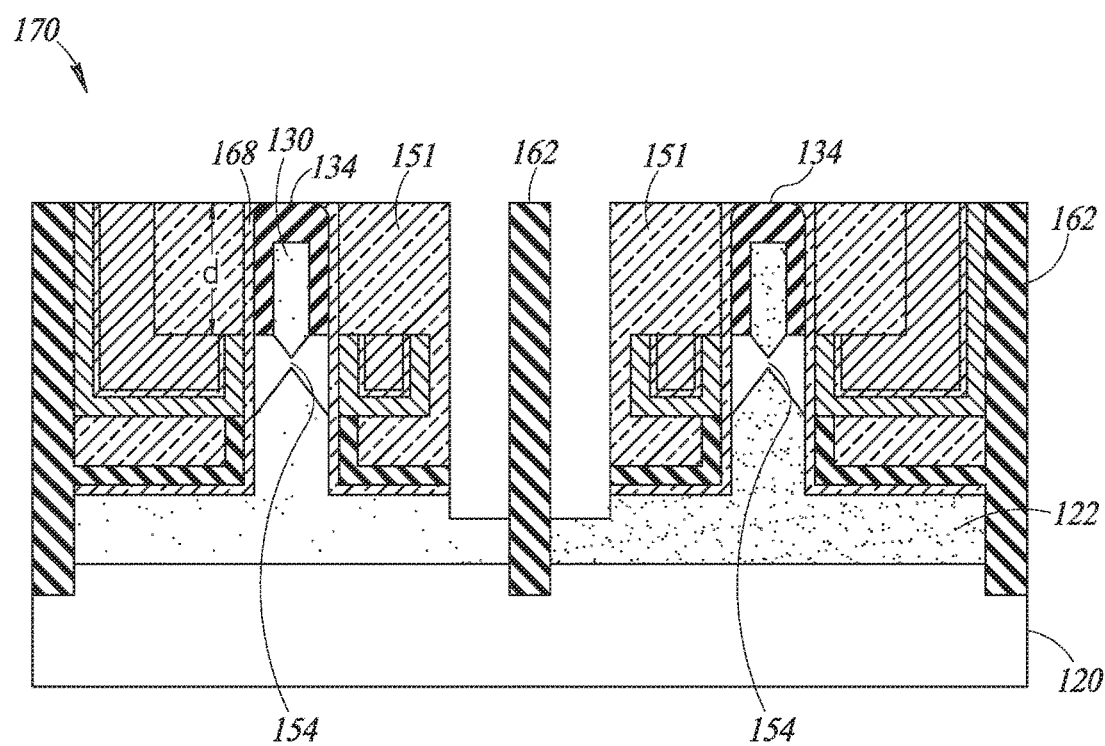
FIGS. 17B and 18B are cross-sectional views of gate-all-around vacuum channel transistors during fabrication of source and drain contacts, according to one embodiment as described herein.
Figure 18A:
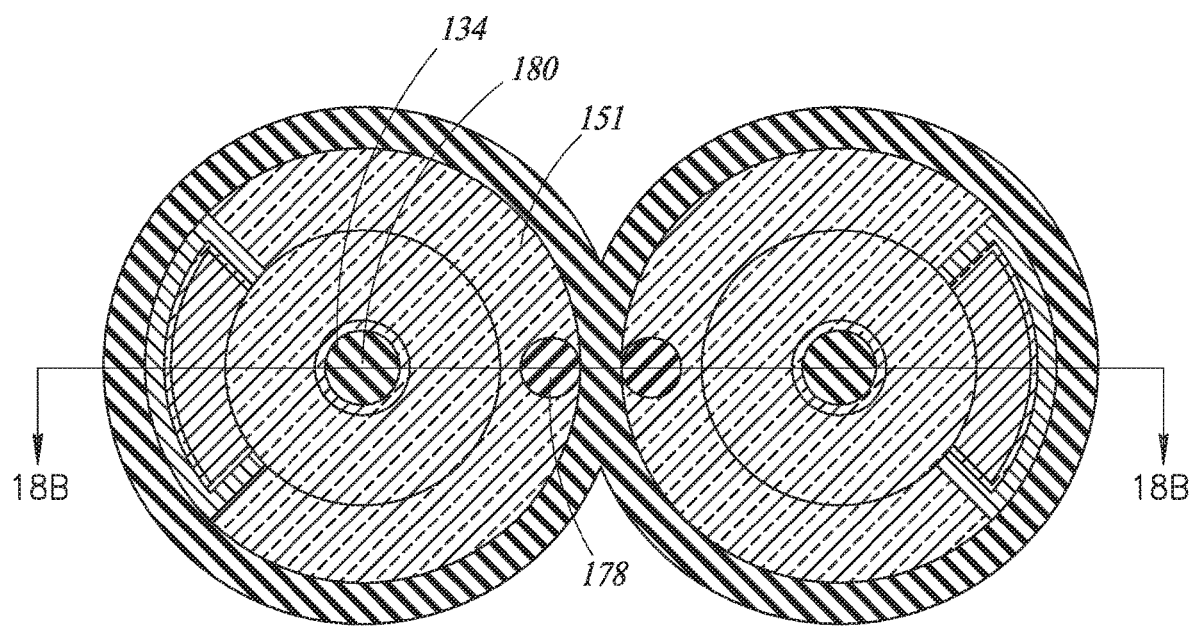
Figure 18B:
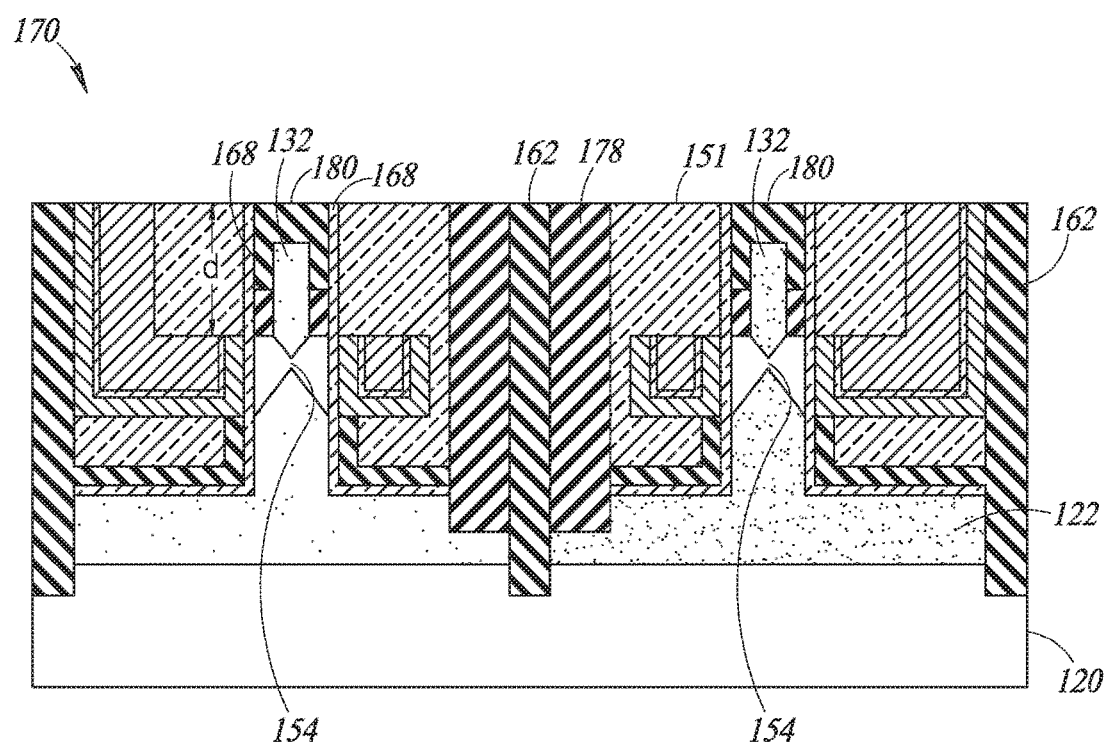

The completed gate-all-around vacuum channel transistors shown in FIGS. 17A, 17B can be replicated to form an integrated circuit in which footprints of adjacent pillars, as shown in FIG. 12C, for example, can be offset from one another to increase the packing density of the vertical transistors.

The present disclosure is directed to a device that includes a semiconductor substrate having a doped surface layer, a vertical pillar formed from the doped surface layer, a source formed as a first portion of the vertical pillar, the first portion having a top surface shaped generally as a first point, a drain formed as a second portion of the vertical pillar, the second portion having a bottom surface shaped generally as a second point spaced apart from the first point by a first gap, a first insulator surrounding the source, a second insulator surrounding the drain, a second gap between the first and second insulators, and an annular metal gate concentric with the vertical pillar, the annular metal gate aligned with the first gap and spaced apart from the second gap by the first insulator.

The device includes gas that fills the first and second gaps. The gas includes one or more of argon, helium, neon, oxygen and nitrogen. One or both of the insulators includes a plurality of insulating materials. The device includes front side electrical contacts to the source, gate and drain. The device includes isolation regions in the semiconductor substrate, the isolation regions separating the device from neighboring circuitry. The first gap is less than 10 nm wide. The doped surface layer has a concentration in the range of $1.0 \, E \, 19 - 1.0 \, E \, 21 \, cm^{-3}$. The first portion of the vertical pillar is wider than the second portion of the vertical pillar.

The present disclosure is also directed to a method that includes doping a surface layer of a semiconductor substrate, forming a pillar in the surface layer, the pillar having a narrow portion above a wide portion, the narrow and wide portions meeting at a junction, exposing portions of the pillar near the junction, surrounding the pillar with a layer of oxide, forming a pair of notches in the exposed portions of the pillar, the notches segmenting the pillar and defining two conical surfaces spaced apart by a gap, removing portions of the oxide from around the gap, and forming a metallic ring around the gap, the ring spaced apart from the pillar by an insulator.

The method includes forming the pair of notches entails use of an oxidation process. Removing portions of the oxide from around the gap further includes bracing the pillar on a first side, removing oxide adjacent to the pillar on a second side, opposite the first side, replacing the oxide adjacent to the pillar on the second side without replacing oxide around the gap, bracing the pillar on the second side, removing oxide adjacent to the pillar on the first side, and replacing the oxide adjacent to the pillar on the first side without replacing oxide around the gap. One or more of the replacing steps uses a gas cluster ion beam process. The method includes forming electrical contacts to the metallic ring, the surface layer, and the narrow portion of the pillar. The method includes forming isolation regions in the substrate that isolate the pillar and the electrical contacts from neighboring circuitry. The bracing entails use of the isolation regions as supports. Wide and narrow portions of the pillar are source and drain regions of a transistor, respectively, and the metallic ring is a transistor gate. The wide and narrow portions of the pillar are drain and source regions of the transistor, respectively, and the metallic ring is a transistor gate.

The devices of the present disclosure, may be included in an integrated circuitry where a plurality of devices includes devices in which a surface layer is doped with negative ions and devices in which the surface layer is doped with positive ions.

U.S. patent application Ser. No. 15/191,359 and U.S. Provisional Patent application No. 62/187,245 are incorporated by reference herein in their entirety.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The various embodiments described above can be combined to provide further embodiments. All of the U.S. patents, U.S. patent application publications, U.S. patent applications, foreign patents, foreign patent applications and non-patent publications referred to in this specification and/ or listed in the Application Data Sheet are incorporated herein by reference, in their entirety. Aspects of the embodiments can be modified, if necessary to employ concepts of the various patents, applications and publications to provide yet further embodiments.

The invention claimed is:

1. A device, comprising:
a substrate;
a first semiconductor pillar structure oriented in a first direction, the first semiconductor structure having a first tapered end pointing away from the substrate;
a second semiconductor pillar structure oriented in the first direction and spaced apart from the first semiconductor pillar structure, the second semiconductor structure having a second tapered end pointing toward the substrate;
a gap region between the first semiconductor pillar structure and the second semiconductor pillar structure; and
a gate structure adjacent to the gap region in a second direction transverse to the first direction.

2. The device of claim 1, wherein the first and second tapered ends face one another and are separated by the gap region.

3. The device of claim 1, wherein the gate structure surrounds the gap region.

4. The device of claim 3, wherein the gate structure surrounds at least a portion of each of the first semiconductor pillar structure and the second semiconductor pillar structure.

5. The device of claim 1, wherein the first semiconductor pillar structure has a first dimension in the second direction, the second semiconductor pillar structure has a second dimension in the second direction, and the first dimension is greater than the second dimension.

6. The device of claim 1, further comprising a first dielectric layer that surrounds the first semiconductor pillar structure, the gate region and the second semiconductor pillar structure in the second direction.

7. The device of claim 6, further comprising a second dielectric layer that surrounds only the second semiconductor pillar structure in the second direction, the second dielectric layer positioned between the first dielectric layer and the second semiconductor pillar structure.

8. The device of claim 7, further comprising a first conductive structure contacting a first portion of the second semiconductor pillar structure; and
wherein the second dielectric layer surrounds a second portion of the second semiconductor pillar structure, the second portion being closer to the gap region than the first portion.

9. The device of claim 1, wherein the first semiconductor pillar structure and the second semiconductor pillar structure are doped with a same conductivity type.

10. The device of claim 1, wherein the substrate includes a doped region, the first semiconductor pillar structure extends from the doped region, and the first semiconductor pillar structure is doped with a same conductivity type as the doped region.

11. The device of claim 10, further comprising a second conductive structure contacting the doped region.

12. A device, comprising:
a substrate;
a vertical stack over the substrate, the vertical stack including:
a first portion having a first tapered end; and
a second portion over the first portion and having a second tapered end that faces the first tapered end; and
a gate structure laterally adjacent to the first tapered end and the second tapered end.

13. The device of claim 12, wherein the first tapered end and the second tapered end are separated by a gap.

14. The device of claim 12, comprising an oxide spacer spaced apart from the second portion, wherein the second tapered end is spaced apart from the oxide spacer.

15. The device of claim 14, further comprising a conductive contact structure between the oxide spacer and the second portion.

16. The device of claim 12, wherein the gate structure is around the vertical stack.

17. The device of claim 12, wherein the gate surrounds the first tapered end and the second tapered end.

18. A device, comprising:
- a substrate;
- a source structure over the substrate, the source structure having a first point;
- a drain structure over the source structure, the drain structure having a second point spaced apart from the first point by a first gap;
- an insulator layer surrounding the drain structure and overlapping the source structure; and
- a gate surround the first gap.

19. The device of claim 18, further comprising a gas that fills the first gap.

20. The device of claim 19, wherein the gas includes one or more of argon, helium, neon, oxygen and nitrogen.

* * * * *